(12) United States Patent
Kuo

(10) Patent No.: US 10,170,436 B1
(45) Date of Patent: Jan. 1, 2019

(54) FLASH MEMORY DEVICE HAVING FLAME RESISTANT

(71) Applicant: INNODISK CORPORATION, New Taipei (TW)

(72) Inventor: Chin-Chung Kuo, New Taipei (TW)

(73) Assignee: Innodisk Corporation, New Taipei (TW)

( * ) Notice: Subject to any disclaimer, the term of this patent is extended or adjusted under 35 U.S.C. 154(b) by 0 days.

(21) Appl. No.: 15/921,889

(22) Filed: Mar. 15, 2018

(30) Foreign Application Priority Data

Aug. 1, 2017 (TW) .............................. 106125970 A

(51) Int. Cl.
| | |
|---|---|
| *G11C 16/04* | (2006.01) |
| *H01L 23/00* | (2006.01) |
| *H01L 27/11517* | (2017.01) |
| *H01L 23/50* | (2006.01) |
| *H01L 23/06* | (2006.01) |
| *H01L 23/538* | (2006.01) |
| *H01L 23/32* | (2006.01) |

(52) U.S. Cl.
CPC ............ *H01L 23/564* (2013.01); *H01L 23/06* (2013.01); *H01L 23/32* (2013.01); *H01L 23/50* (2013.01); *H01L 23/5387* (2013.01); *H01L 27/11517* (2013.01)

(58) Field of Classification Search
CPC ....... G11C 16/04; H01L 23/564; H01L 23/06; H01L 23/32; H01L 23/50; H01L 23/5387; H01L 27/11517
USPC .................................... 365/185.01–185.33
See application file for complete search history.

(56) References Cited

U.S. PATENT DOCUMENTS

| | | | | |
|---|---|---|---|---|
| 7,635,653 | B2 * | 12/2009 | Hashimoto | ..... H01L 21/823462 257/E21.625 |
| 2002/0197800 | A1 * | 12/2002 | Hashimoto | ..... H01L 21/823462 438/266 |
| 2007/0093027 | A1 * | 4/2007 | Hashimoto | ..... H01L 21/823462 438/264 |

* cited by examiner

*Primary Examiner* — Harry W Byrne
(74) *Attorney, Agent, or Firm* — Rosenberg, Klein & Lee

(57) ABSTRACT

The invention provides a flash memory device having flame resistant, which comprises a first shell, a first circuit board, and a first transmission interface. The first circuit board comprises a controller and a plurality of flash memory elements, is disposed within the first shell, and is covered by a fire protection material. The first transmission interface is disposed outside the first shell. A circuit connection line is connected between the first circuit board and the first transmission interface. By the flash memory elements being accommodated within the fire resistant shell, the fire resistant shell will be for isolating high temperature to avoid the flash memory elements to be burned when the flash memory device exists in a fire scene.

10 Claims, 5 Drawing Sheets

FLASH MEMORY DEVICE HAVING FLAME RESISTANT

This non-provisional application claims priority claim under 35 U.S.C. § 119 (a) on Taiwan Patent Application No. 106125970 filed Aug. 1, 2017, the entire contents of which are incorporated herein by reference.

FIELD OF THE INVENTION

The present invention is related to a flash memory device having flame resistant, particularly to a flash memory device for avoiding the flash memory element to be burned.

BACKGROUND

Most buses today are mostly configured with digital video recorders (DVRs). By the configuration of the digital video recorder, the status of passengers in the bus can be monitored, and the video recording function of the digital video recorder can be used to record the video during unexpected events. Afterwards, the video recorded by the digital video recorder will be used as an evidence to clarify their responsibilities.

Digital video recorder usually uses a flash memory device as a storage medium for recording video. Referring to FIG. 1, there is shown a circuit construction diagram of the flash memory device according to the prior art. As shown in FIG. 1, the flash memory device 100 is placed within a digital video recorder, and comprises a shell 10. The shell 10 is a metal shell. A circuit board 11 will be disposed within the shell 10. The circuit board 11 comprises a controller 13, a plurality of flash memory elements 15, and a transmission interface 17. The controller 13 is connected to the flash memory elements 15 and the transmission interface 17, respectively. The transmission interface 17 is protruded outside the shell 10.

The conventional flash memory device 100 does not have a design about the fire protection and flame resistant. When the bus fires due to a breakdown or a traffic accident, the fire source causes the metal shell 10 of the flash memory device 100 to be heated and warmed up, and therefore makes the inside of the metal shell 10 placed in a high temperature environment, such that the controller 13 and the flash memory elements 15 will be burned; otherwise, the fire source also conducts heat to the circuit board 11 via pins (such as ground pins) of the transmission interface 17, and therefore burns the controller 13 and the flash memory elements 15 on the circuit board 11. The storage data of the burned flash memory elements will damage and cannot be read. Thus, the Fire incidents will not be able to restore the truth through the burned flash memory elements 15.

For the above reason, the present invention provides a flame-resistant flash memory device, which will implement a design of fire protection for the flash memory elements to avoid the flash memory elements to be burned, and ensure the safety of the data stored in the flash memory elements, which is the object to be achieved by the present invention.

SUMMARY

It is one objective of the present invention to provide a flash memory device, in which a circuit board with flash memory elements is placed inside a shell having fire protection material, when the event of a fire, since the flash memory elements is covered in the fire protection material of the shell that can effectively isolate the high temperature so as to avoid the flash memory elements to be burned.

It is another objective of the present invention to provide a flash memory device, in which the circuit board with flash memory elements is covered by the fire protection material of the shell, the circuit board transmits the signals via a circuit connection line passed through the fire resistant shell, the copper foil of circuit layouts of the circuit connection line will be burned and broken when a fire occurs, in such a way that the heat source generated by the fire will not be conducted to the circuit board, placed inside the fire resistant shell, via the circuit layouts of the circuit connection line, so as to ensure that the flash memory elements on the first circuit board are not burned by the conductive high temperature.

To achieve the above object, the present invention provides a flash memory device having flame resistant, comprising: a first shell; a first circuit board comprising a controller and a plurality of flash memory elements connected to the controller, wherein the first circuit board is disposed within the first shell, and covered by a ceramic fiber material or a fire protection material with plasticity, and a first transmission interface disposed outside the first shell, wherein a circuit connection line is connected between the first transmission interface and the first circuit board.

In one embodiment of the present invention, wherein the first shell is a metal shell, or a shell made of fire protection material.

In one embodiment of the present invention, wherein the circuit connection line is a flexible printed circuit board or a flexible flat cable line.

In one embodiment of the present invention, wherein a solder or a passive component is configured on at least one circuit layout of the circuit connection line, respectively.

In one embodiment of the present invention, wherein the circuit connection line is a hard circuit adapter board, a solder or a passive component is configured on at least one circuit layout of the circuit connection line, respectively.

In one embodiment of the present invention, wherein the first circuit board further comprises a second transmission interface connected to the controller, the first circuit board is connected to the circuit connection line by the second transmission interface.

The present invention further provides a flash memory device having flame resistant, comprising: a first shell; a first circuit board comprising a plurality of flash memory elements, wherein the first circuit board is disposed within the first shell, and covered by a ceramic fiber material or a fire protection material with plasticity; a second shell; and a second circuit board comprising a controller and a transmission interface connected to the controller, wherein the first shell and the second circuit board are disposed within the second shell, a circuit connection line is provided with one end connected to the second circuit board, and provided with other end passed through the first shell and connected to the first circuit board disposed within the first shell.

DETAILED DESCRIPTION OF THE PREFERRED EMBODIMENTS

Figure 1:
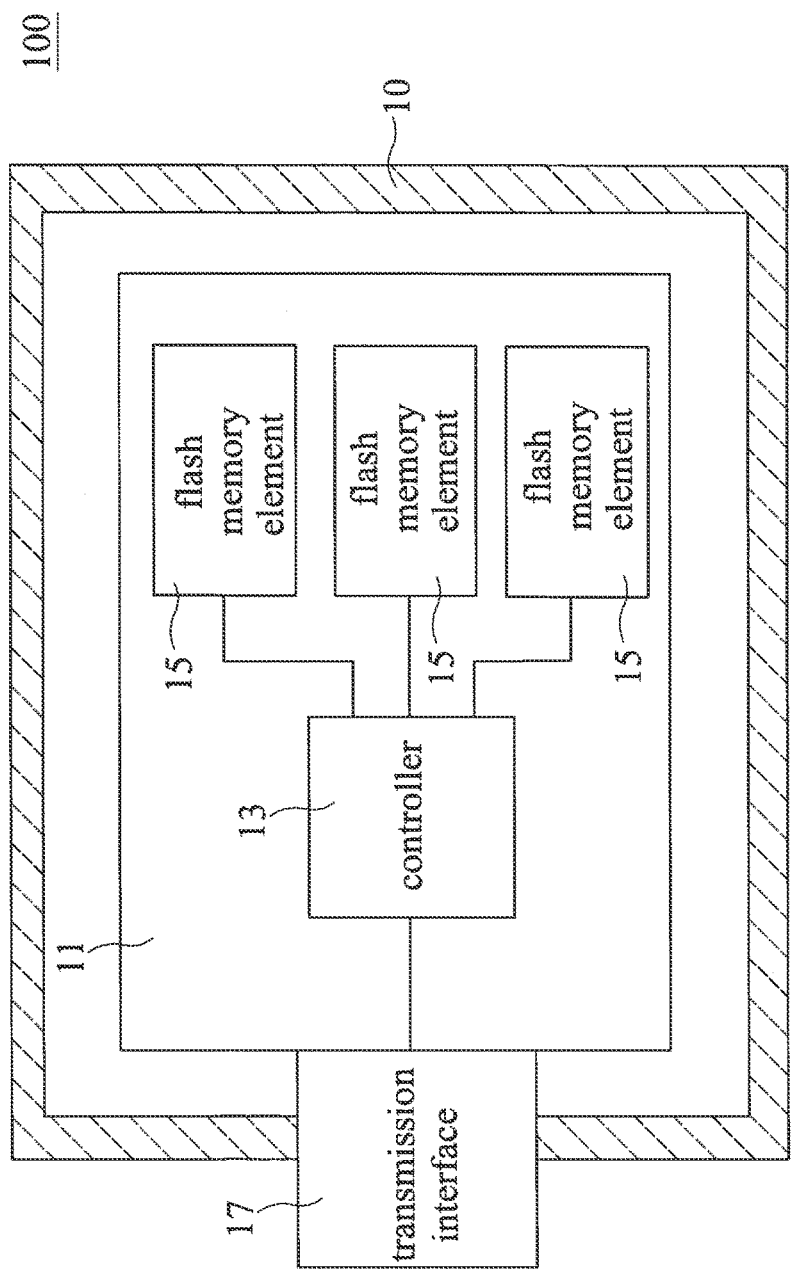
FIG. 1 is shown a circuit construction diagram of the flash memory device according to the prior art.
Figure 2:
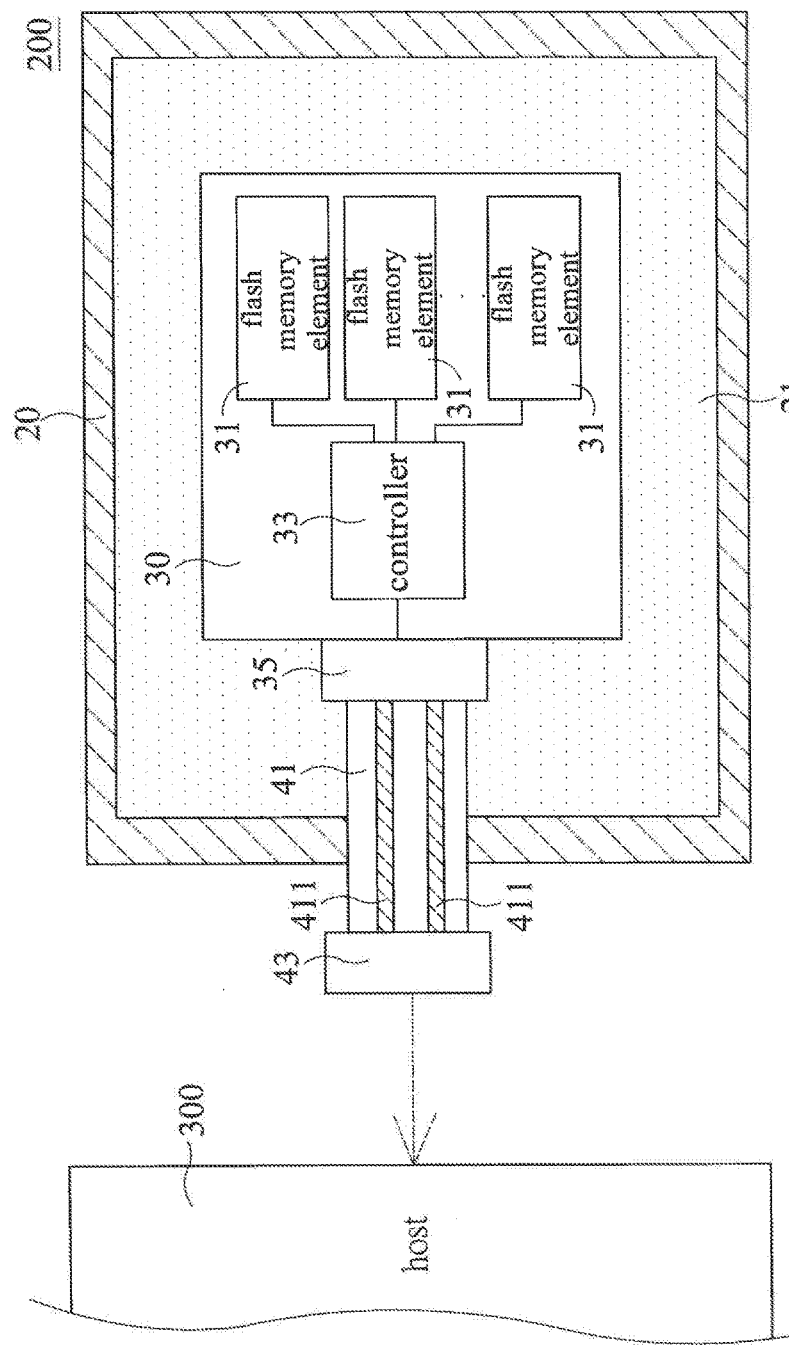
FIG. 2 is shown a circuit construction diagram of the flash memory device according to one embodiment of the present invention.

Referring to FIG. 2, there is shown a circuit construction diagram of the flash memory device according to one embodiment of the present invention. As shown in FIG. 2, the flash memory device 200 is applied in a video recording for a digital video recorder or a drive recorder, and comprises a first shell 20, a first circuit board 30, and a first transmission interface 43. The first shell 20 may be a metal shell, or a fire resistant shell, for example, ceramic fiber shell. The first circuit board 30 is disposed within the first shell 20, and covered by a fire protection material 21. For example, the fire protection material 21 is a ceramic fiber material or a fire protection material with plasticity.

The first circuit board 30 is an epoxy fiberglass board (FR4), and comprises a plurality of flash memory elements 31 and a controller 33. The controller 33 is connected to the flash memory elements 31. The first transmission interface 43 is disposed outside the first shell 20. The first circuit board 30 is connected to the first transmission interface 43 via a circuit connection line 41 passed through the first shell 20. The flash memory device 200 is electrically connected to a host 300 via the use of the first transmission interface 43. The first circuit board 30 further comprises a second transmission interface 35 connected to the controller 33. The first circuit board 30 is connected to the circuit connection line 41 via the second transmission interface 35.

The host 300 of the present invention may be a digital video recorder or a drive recorder. When the host 300 is running, the recorded video is transmitted to the inside of the flash memory device 200 via the first transmission interface 43 and the circuit connection line 41. The controller 33 of the first circuit board 30 issues an access command to the flash memory elements 31 so that the flash memory elements 31 can store the video recorded by the host 300 according to the request of the access command.

When the flash memory device 200 is at a fire scene, for example, a scene of a car fire, since the flash memory elements 31 is covered by the fire protection material 21 of the first shell 20 that can effectively isolate the external high temperature so as to avoid the flash memory elements 31 to be burned.

In one embodiment of the present invention, the circuit connection line 41 is a flexible printed circuit (FPC) board or a flexible flat cable (FCC) line. When the flash memory device 200 is at a fire scene, the copper foils of the circuit layouts 411 of the circuit connection line 41 will be burned and broken, for example, the ambient temperature of the fire scene may exceed 300 degrees, the copper foils of the circuit layouts 411 of the circuit connection line 41 will be burned and broken because of the high temperature. Thus, the heat source generated by the fire will not be conducted to the first circuit board 30 via the circuit connection line 41, so as to ensure that the flash memory elements 31 on the first circuit board 30 are not burned by the conductive high temperature. After the fire scene is extinguished, a memory reading device is used to read the video data stored in the flash memory elements 31, and the read video data is used to determine the cause of the fire.

Figure 3:
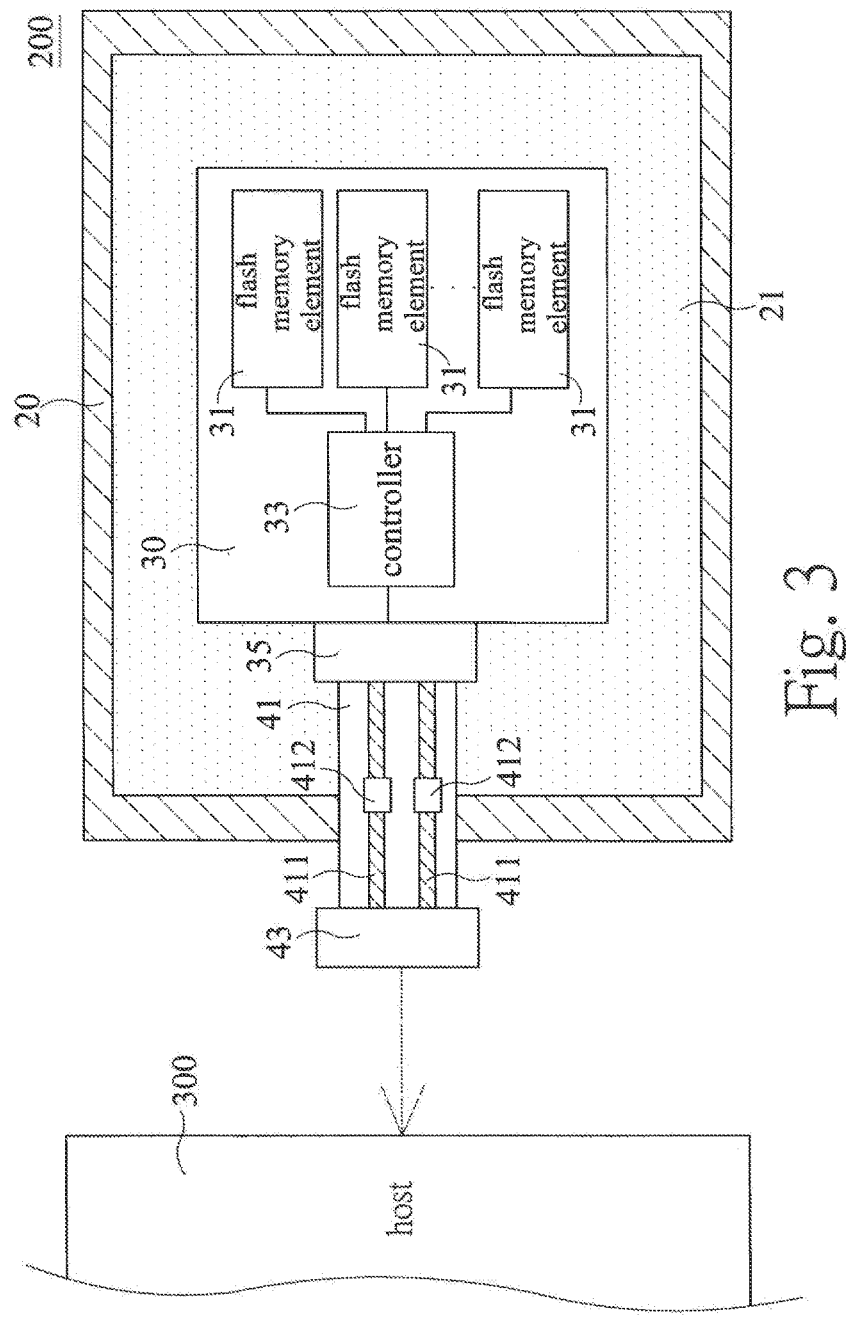
FIG. 3 is shown a circuit construction diagram of the flash memory device according to another embodiment of the present invention.

Referring to FIG. 3, there is shown a circuit construction diagram of the flash memory device according to another embodiment of the present invention. As shown in FIG. 3, a solder 412 or a passive component (such as zero-ohm resistance) is configured on each of circuit layouts 411 of the circuit connection line 41, respectively. When the flash memory device 200 is at the fire scene, the solders 412 or the passive components will be melted or burned before the copper foils of the circuit layouts 411 is burned and broken. After the solders 412 have been melted or the passive components have been burned, the circuit layouts 411 will be in a broken circuit state, in such a way that the heat source with the high temperature can be prevented from being conducted to the first circuit board 30 via the circuit layouts 411 of the circuit connection line 41 to reduce the probability of the flash memory elements 31 to be burned.

In the present embodiment, the circuit connection line 41 is the FPC board or the FCC line, or a hard circuit adapter board with high temperature resistant, for example, hard circuit adapter board made of FR4 material.

Figure 4:
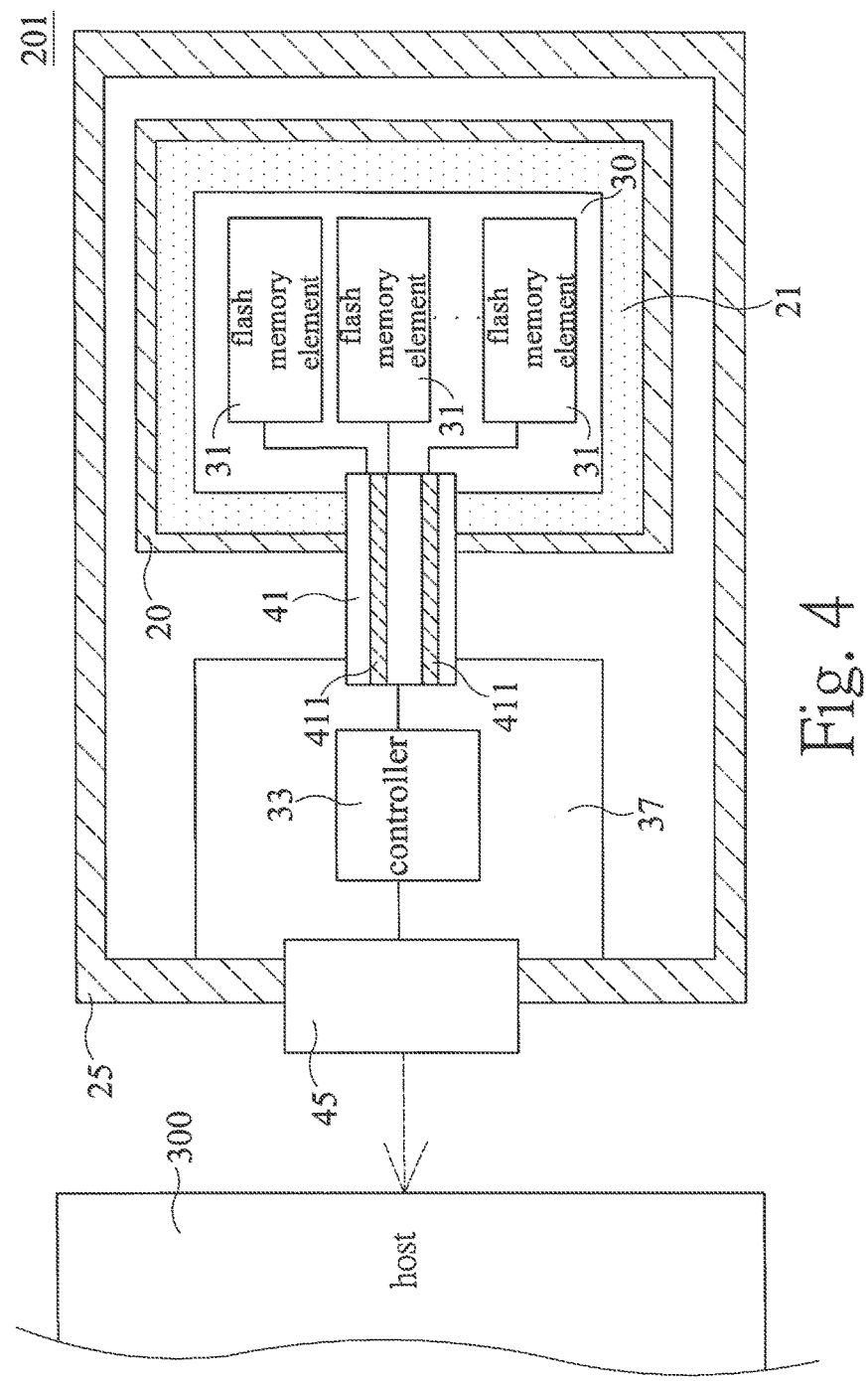
FIG. 4 is shown a circuit construction diagram of the flash memory device according to another embodiment of the present invention.

Referring to FIG. 4, there is shown a circuit construction diagram of the flash memory device according to another embodiment of the present invention. Compared to the flash memory elements 31 and the controller 33 of the flash memory device 200 of the above embodiment being disposed on the same circuit board, the flash memory elements 31 and the controller 33 of the flash memory device 201 of the present embodiment are disposed on different circuit boards, respectively.

As shown in FIG. 4, the flash memory device 201 of the present embodiment comprises a first shell 20, a first circuit board 30, a second shell 25, and a second circuit board 37. The first shell 20 is a metal shell, or a fire resistant shell. The second shell 25 is a metal shell. The first circuit board 30 and the second circuit board 37 are an FR4 printed circuit board, respectively.

The first circuit board 30 is disposed within the first shell 20, and covered by a fire protection material 21, for example, ceramic fiber material or fire protection material with plasticity. The first shell 20 and the second circuit board 37 are disposed within the second shell 25. The first circuit board 30 comprises a plurality of flash memory elements 31. The second circuit board 37 comprises a controller 33 and a transmission interface 45. The controller 33 is connected to the transmission interface 45. The transmission interface 45 is protruded outside the second shell 25. The flash memory device 201 is connected to the host 300 via the flash memory device 201. Furthermore, a circuit connection line 41 is provided with one end connected to the second circuit board 37, and provided with other end passed through the first shell 20 and connected to the first circuit board 30 disposed within the first shell 20. The flash memory elements 31 and the controller 33 can transmit data via the circuit connection line 41. In the present embodiment, the circuit connection line 41 is a flexible printed circuit (FPC) board or a flexible flat cable (FCC) line.

When the flash memory device 201 is at the fire scene, the second shell 25 of the flash memory device 201 will be heated by the fire source, the inside of the second shell 25 will be in a high temperature environment, resulting in the controller 33 of the second circuit board 37 will be burned. Besides, since the flash memory elements 31 is covered by the fire protection material 21 of the first shell 20 that can effectively isolate the high temperature in the inside of the second shell 25 so as to avoid the flash memory elements 31 to be burned.

Similarly, when the flash memory device 201 is at the fire scene, the copper foils of the circuit layouts 411 of the circuit connection line 41 is also burned and broken, and thus the heat source generated by the fire will not be conducted to the first circuit board 30 via the circuit connection line 41, the heat source generated by the fire will not be conducted to the first circuit board 30 via the circuit connection line 41, so as to ensure that the flash memory elements 31 on the first circuit board 30 are not burned by the conductive high temperature.

Figure 5:
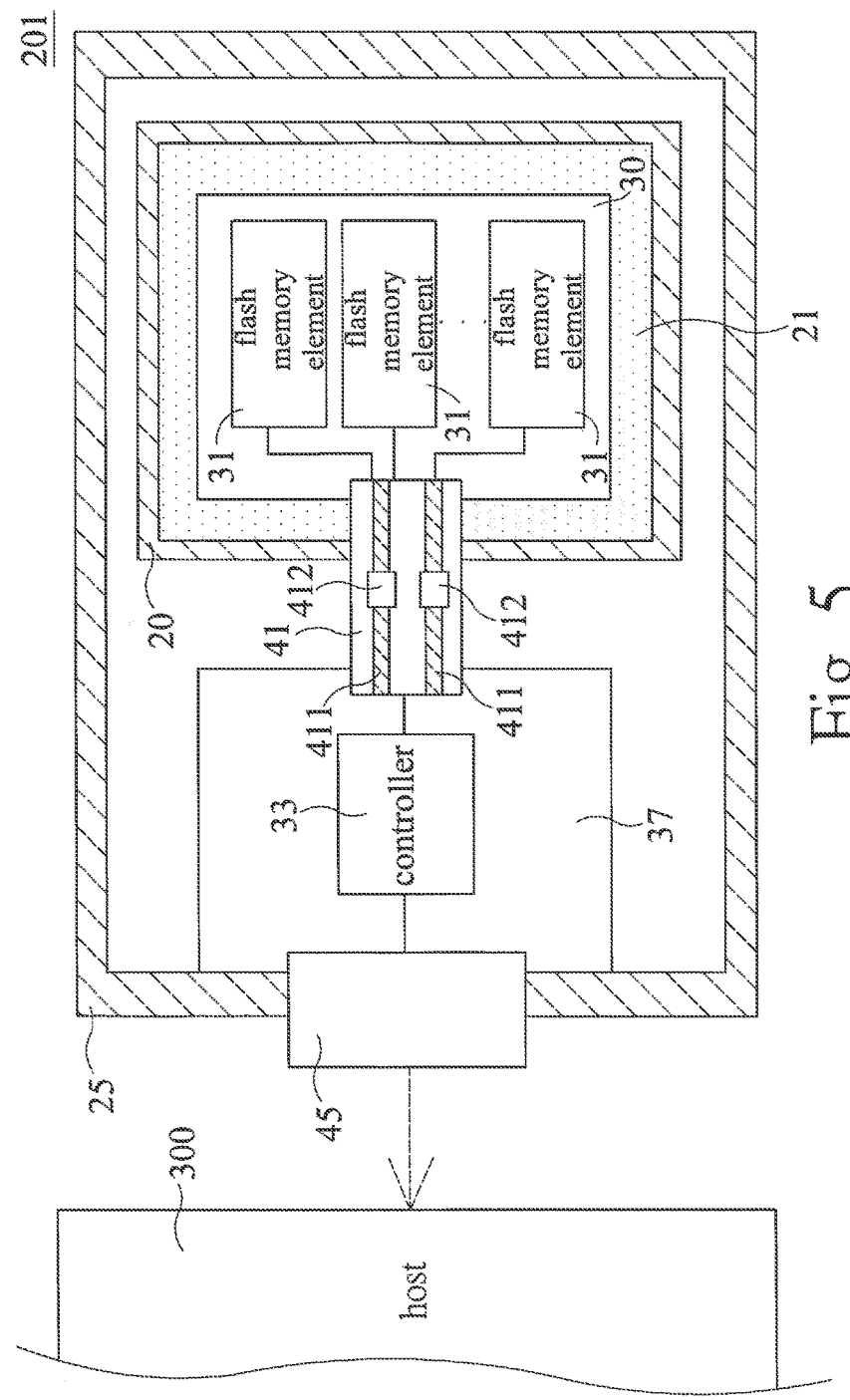
FIG. 5 is shown a circuit construction diagram of the flash memory device according to another embodiment of the present invention.

Referring to FIG. 5, there is shown a circuit construction diagram of the flash memory device according to another embodiment of the present invention. As shown in FIG. 5, the solder 412 or the passive component is also configured on each of circuit layouts 411 of the circuit connection line 41, respectively. And, the circuit connection line 41 is an FPC board or an FCC line, or a hard circuit adapter board made of FR4 material.

When the flash memory device 201 is at the fire scene, the solders 412 or the passive components will be melted or burned before the copper foils of the circuit layouts 411 is burned and broken, so that the circuit layouts 411 is in a broken circuit state. Thus, when the flash memory device 201 is in the high temperature environment, the heat source with the high temperature can be prevented from being conducted to the first circuit board 30 via the circuit layouts 411 of the circuit connection line 41 to reduce the probability of the flash memory elements 31 to be burned.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:

1. A flash memory device having flame resistant, comprising:
   a first shell;
   a first circuit board comprising a controller and a plurality of flash memory elements connected to the controller, wherein the first circuit board is disposed within the first shell, and covered by a ceramic fiber material or a fire protection material with plasticity; and
   a first transmission interface disposed outside the first shell, wherein a circuit connection line is connected between the first transmission interface and the first circuit board.

2. The flash memory device according to claim 1, wherein the first shell is a metal shell, or a shell made of fire protection material.

3. The flash memory device according to claim 1, wherein the circuit connection line is a flexible printed circuit board or a flexible flat cable line.

4. The flash memory device according to claim 1, wherein a solder or a passive component is configured on at least one circuit layout of the circuit connection line, respectively.

5. The flash memory device according to claim 1, wherein the circuit connection line is a hard circuit adapter board, a solder or a passive component is configured on at least one circuit layout of the circuit connection line, respectively.

6. The flash memory device according to claim 1, wherein the first circuit board further comprises a second transmission interface connected to the controller, the first circuit board is connected to the circuit connection line by the second transmission interface.

7. A flash memory device having flame resistant, comprising:
   a first shell;
   a first circuit board comprising a plurality of flash memory elements, wherein the first circuit board is disposed within the first shell, and covered by a ceramic fiber material or a fire protection material with plasticity;
   a second shell; and
   a second circuit board comprising a controller and a transmission interface connected to the controller, wherein the first shell and the second circuit board are disposed within the second shell, a circuit connection line is provided with one end connected to the second circuit board, and provided with other end passed through the first shell and connected to the first circuit board disposed within the first shell.

8. The flash memory device according to claim 7, wherein the first shell is a metal shell, or a shell made of fire protection material.

9. The flash memory device according to claim 7, wherein the circuit connection line is a flexible printed circuit board or a flexible flat cable line.

10. The flash memory device according to claim 7, wherein a solder or a passive component is configured on at least one circuit layout of the circuit connection line, respectively.

* * * * *